United States Patent [19]
Harrison et al.

[11] Patent Number: 6,002,206
[45] Date of Patent: Dec. 14, 1999

[54] ORGANIC EL DEVICES AND OPERATION THEREOF

[75] Inventors: Nick Harrison; Nir Tessler, both of Cambridge; Paul May, Cambs, all of United Kingdom

[73] Assignee: Cambridge Display Technology Limited, Cambridge, United Kingdom

[21] Appl. No.: 08/934,873

[22] Filed: Sep. 22, 1997

[30] Foreign Application Priority Data

Nov. 28, 1996 [GB] United Kingdom .................... 9624705
Jan. 7, 1997 [GB] United Kingdom .................... 9700148

[51] Int. Cl.⁶ ........................................................ H01J 1/62
[52] U.S. Cl. .......................... 313/506; 313/503; 313/631; 315/169.3
[58] Field of Search ...................................... 313/506, 505, 313/503, 493, 631; 345/78, 80; 315/169.3

[56] References Cited

U.S. PATENT DOCUMENTS

| 4,253,097 | 2/1981 | Hochstrate | 340/781 |
| 5,399,936 | 3/1995 | Namiki et al. | |
| 5,670,792 | 9/1997 | Utsugi et al. | 257/59 |
| 5,707,745 | 1/1998 | Forrest et al. | 428/432 |
| 5,798,170 | 8/1998 | Zhang et al. | 428/212 |

FOREIGN PATENT DOCUMENTS

WO 96/36959  11/1996  WIPO.

OTHER PUBLICATIONS

"Electroluminescence in Polymer Films", published in Nature, vol. 386, Mar. 13, 1997, p. 135.
"Nanosecond Transient Electroluminescence from Polymer Light–Emitting Diodes", published in Applied Physics Letters, 61(26), Dec. 28th, 1992, pp. 3092–3094.
"Semiconducting Polymers: A New Class of Solid–State Laser Materials", published in Science, vol. 273, Sep. 27th, 1996, pp. 1833–1836.
"Photophysics of Phenylenevinylene Polymers", published in Synthetic Metals 80(1996), pp. 41–58.

*Primary Examiner*—Sandra O'Shea
*Assistant Examiner*—Michael Smith
*Attorney, Agent, or Firm*—Merchant & Gould, P.C.

[57] ABSTRACT

An organic electroluminescent device, particularly for use as a display, is disclosed which is driven according to a pulsed mode of operation which allows much higher current densities to be injected into the device. This is achieved by selection of particular pulse durations and duty cycles, and by an improved geometry for the electroluminescent device in which the resistance of anode lines is reduced.

22 Claims, 6 Drawing Sheets

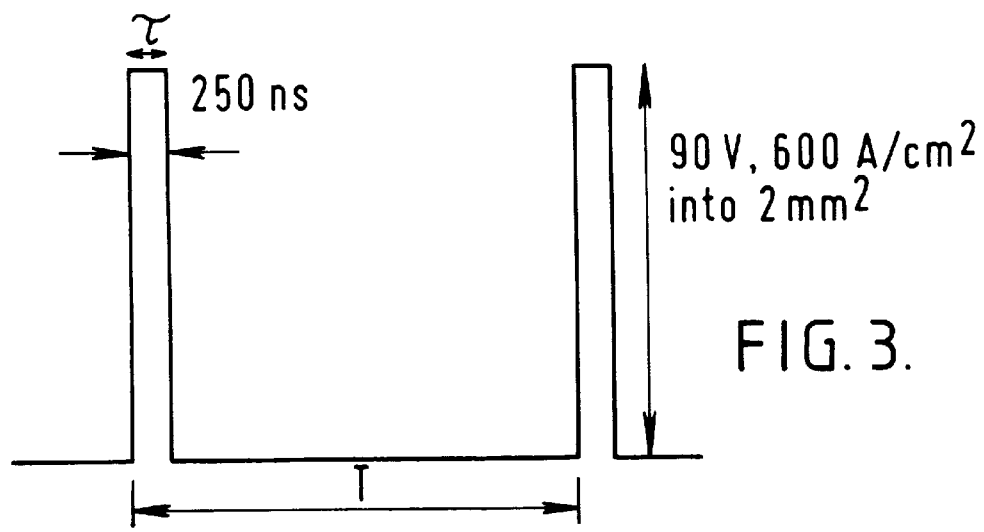
FIG. 3.
FIG. 4.
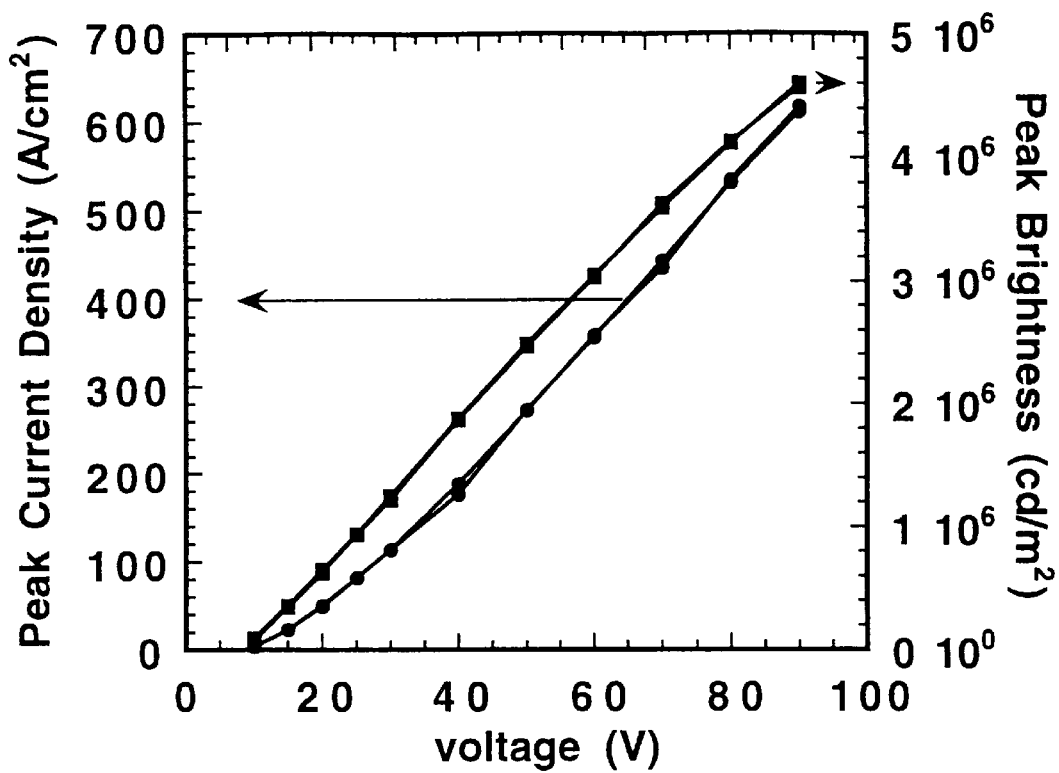

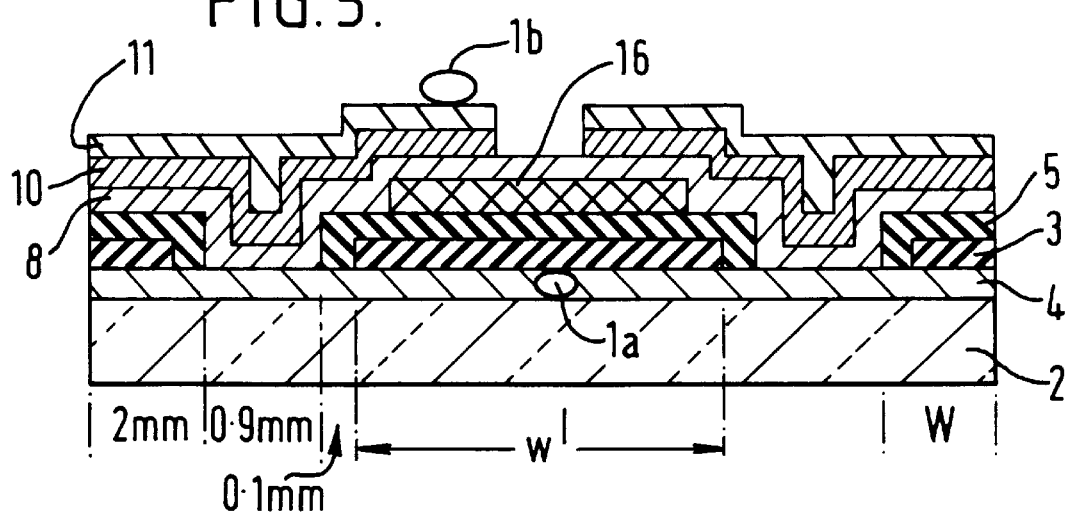
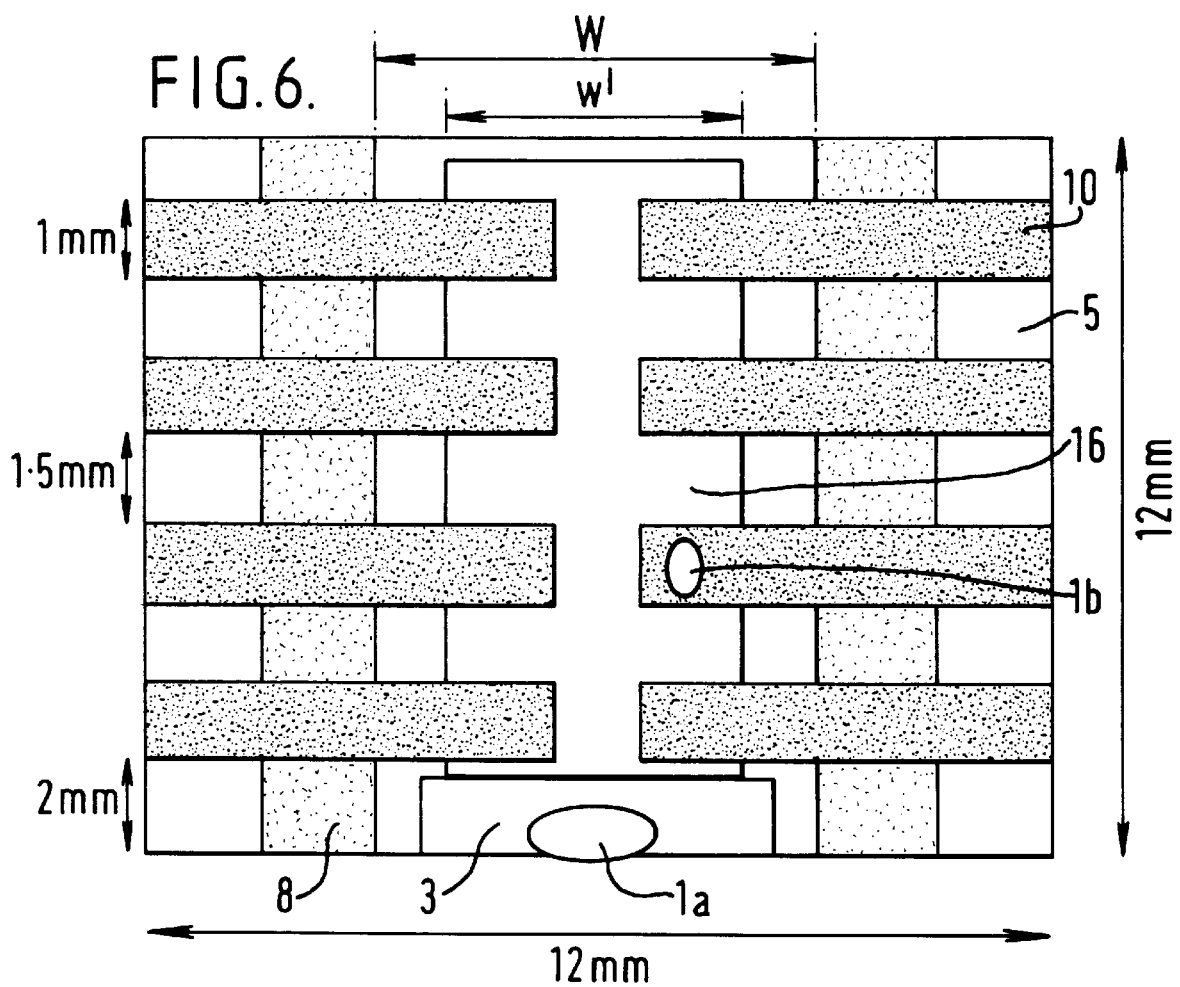

ORGANIC EL DEVICES AND OPERATION THEREOF

FIELD OF THE INVENTION

This invention relates to the use of organic electroluminescent (EL) devices as displays and to the operation thereof.

BACKGROUND OF THE INVENTION

Organic electroluminescent devices are made from materials that emit light when a suitable voltage is applied across electrodes deposited on either side of the organic material. One class of such materials is semiconductive conjugated polymers which have been described in our earlier U.S. Pat. No. 5,247,190, the contents of which are herein incorporated by reference.

One particular advantage such devices have over traditional inorganic light emitting diodes is the ease with which they can be patterned to produce areas of light emission. This is extremely important for the fabrication of dot-matrix displays. The speed of switching of organic light emitting diodes is limited by the transport time of carriers (electrons and holes) moving from their respective electrodes into the material where they combine to form excitons which can radiatively decay to produce light. Because the organic layers can be made very thin (typically <1 micron e.g. 0.1 micron) this transport time can be of order 0.1–1 microsecond even though the mobility of carriers in the organic materials is considerably less (by several orders of magnitude) than the mobility in traditional semiconductors.

One of the primary consequences of this relatively low mobility is a limit to the peak current that can be injected into the device. This is because of space charge effects. Such effects lead to an accumulation of charge within the devices which reduce the further injection of carriers. This has been studied recently in organic LEDs, for example in P. Blom et al, Appl Phys. Lett. p 3308, Vol 68, 1996. The present inventors have reasoned that higher mobilities would lead to higher peak currents and therefore higher peak brightnesses and faster switching times. This is important for many applications including time multiplexed displays. High injection currents are also likely to be required for operation of electrically pumped lasers. If the increase in mobility also leads to a balancing of charge injection this will have the additional benefit of increasing the emission efficiency of these devices.

Attempts have been made to operate electroluminescent devices in a pulsed mode. For example, reference is made to D, Braun et al, Appl. Phys. Lett., p3092, vol. 61, 1992. In that paper, 1 $\mu$s voltage pulses of 40V were applied to an EL device. It is stated that at a duty cycle of 0.5% (1:200), the EL intensity remained proportional to the current up to 10 A/sqcm. We believe this is still much too low to have any significant effect on mobility.

In F. Hide et al in Science, p1833, vol.273, 1996, a possibility of obtaining current densities of 25 A/sqcm when operated with 3 $\mu$s pulses at a low duty cycle of 1:30 is discussed. We believe again that this is too low to have any significant effect on light output or emission efficiency.

In a paper by L. Rothberg et al, Synthetic Metals, p41, vol.80, 1996, it is suggested that a theoretical maximum value for peak current injection would be 200 A/sqcm. However this is based on expectations for carrier mobility in PPV and removal of space charge limits which are wholly unrealistic in the context described by Rothberg.

It is an object of the present invention to provide a pulsed mode of operation of an EL device which significantly exceeds any existing realistic expectations of current density.

SUMMARY OF THE INVENTION

This invention relates to a technique for increasing the carrier mobility in organic light emitting diodes thus leading to the advantages described above.

According to one aspect of the present invention there is provided an electroluminescent device comprising first and second electrodes and arranged therebetween a layer of an organic light emissive material, the device including circuitry for applying a pulsed voltage between the first and second electrodes to cause the light emissive layer to generate light in an electroluminescent manner, wherein the pulses are applied with a duty cycle in excess of 1:500.

A preferred class of organic light emissive material is semiconductive conjugated polymers. However other light emissive materials are possible such as sublimed molecular films or other small molecule materials.

In the preferred embodiment, the duty cycle of the pulses lies between 1:20,000 and 1:400,000.

In another aspect of the invention there is provided an electroluminescent device comprising first and second electrodes and arranged between said first and second electrodes a layer of an organic light emissive material, the device including circuitry for applying a voltage pulse between said first and second electrodes to cause the light emissive layer to emit light in an electroluminescent manner, the voltage pulse having a peak voltage lying in the range 10–90V and a pulse duration of less than 1 $\mu$s and preferably 0.25 $\mu$s.

The invention also provides methods of operating electroluminescent devices by applying pulsed voltages in accordance with the above parameters.

We have found that by operating an organic electroluminescent device in a pulsed mode with the parameters defined herein, large currents can be injected into the device for short periods of time. The effect of this mode of operation is to increase the charge mobility in these devices by a significant factor over a steady dc current injection device.

In one aspect of the invention, an organic electroluminescent device is operated in a pulsed mode where large current densities in excess of 50 A/sqcm, and even in excess of 100 A/sqcm and preferably 500 A/sqcm, are injected into the device for short periods of time, between 0.1 microseconds and 100 microseconds, either as a single pulse or as a repetitive sequence of pulses. The exemplified duration is 0.25 $\mu$s. The effect of this mode of operation is to increase the charge mobility of these devices by a significant factor over a steady dc current injection device. The voltages applied to achieve these injection efficiencies can be in the range 10–200V, in particular in the ranges 10–90V or 20–200V. The duration of the pulse is adjusted such that the device is not damaged during the application of the voltage pulse. Pulse duration can be in the range 0.1 $\mu$s to 500 $\mu$s depending on the application, as discussed below.

According to a further aspect of the present invention there is provided an electroluminescent device comprising first and second electrodes and arranged therebetween a layer of an organic light emissive material, the device including circuitry for applying a voltage pulse between the first and second electrodes to cause the light emissive layer to generate light in an electroluminescent manner, wherein the first electrode comprises a plurality of planar anode strips extending in a first orientation and the second electrode comprises a plurality of planar cathode strips extending in a second orientation, each anode strip comprising a charge injecting layer, a conductive layer and an insulating layer whereby the resistance of the anode strips is such that a peak current density of greater than 50 A/sqcm is manifest in the light emissive material at an applied voltage of less than 90V.

The charge injecting layer can be selected from the group comprising indium tin oxide, fluorine doped tin oxide and aluminium doped zinc oxide, although indium tin oxide is at the present preferred.

The conductive layer can be selected from aluminium, copper, copper based alloys or aluminium based alloys. This layer is selected for its good conductivity.

The insulating layer can be selected from the group of inorganic insulators for example aluminium oxide, silicon oxides, silicon nitride, spin-on glass or organic insulators such as polyimide.

In another embodiment an organic electroluminescent device is operated in a pulsed mode where the duration, frequency and peak current of the pulses are adjusted to be appropriate for a time multiplexed display. The frequency is determined by the frame rate required and is therefore typically 10–200 Hz and the duration is determined by the line address time which is approximately the frame time divided by the number of lines to be multiplexed in the display, and is therefore typically between 5 microseconds and 500 microseconds. The peak current is adjusted to produce a time average brightness suitable for the display application, typically between 50 and 500 cd/sqm.

In another embodiment an organic electroluminescent device is operated in a pulsed mode where the duration, frequency and peak current of the pulses are adjusted to be appropriate for a time multiplexed display. The frequency is determined by the frame rate required and is therefore typically 10–200 Hz. The duration is arranged to be a fraction of the line address time which is approximately the frame time divided by the number of lines to be multiplexed in the display. Pulse durations are usefully between 0.1 microseconds and 10 microseconds and preferably less then 1 $\mu$s. The peak current is adjusted to produce a time average brightness suitable for the display application, typically between 50 and 500 cd/sqm.

In another embodiment an organic electroluminescent device is operated in a pulsed mode where the duration of the pulses and the peak current injected are adjusted to maximise the integrated charge in a single pulse without damaging the device, and the pulse frequency then also maximised without damaging the device. This mode of operation can enhance the maximum average light output for any particular application.

In another embodiment an organic electroluminescent device is operated in a pulsed mode where the duration of the pulses is adjusted to maximise the peak current. This mode of operation will produce the best conditions for pulsed laser operation of the device. The pulse frequency is adjusted to modify the average laser output power. The construction of such a diode may be based on microcavity structure as discussed in N. Tessler et al, Nature, p695, vol. 382, 1996 and J. Gruener et al, J. Appl. Phys., P207, vol 80, 1996.

In another embodiment an organic electroluminescent device is operated in a pulsed mode where the duration, peak current and pulse frequency are adjusted to take benefit of the increased mobility that can be produced by the pulsed mode of operation, and to optimise the peak and average brightness output required for different applications.

It has been found, surprisingly, that the low duty cycles of this invention, particularly when combined with short pulse durations, allow peak current densities to be injected which are much greater than that which had been observed or expected previously.

BRIEF DESCRIPTION OF THE DRAWINGS

FIG. 3 is a timing diagram showing a drive voltage in pulsed mode;

FIG. 4 is a graph of peak current density and peak brightness against applied voltage in the pulsed mode for the structure of FIGS. 1 and 2;

FIGS. 5 and 6 are a sectional and plan view diagram of a device structure in accordance with a second embodiment;

For a better understanding of the present invention and to show how the same may be carried into effect reference will now be made by way of example to the accompanying drawings.

DESCRIPTION OF THE PREFERRED EMBODIMENTS

Figure 1:
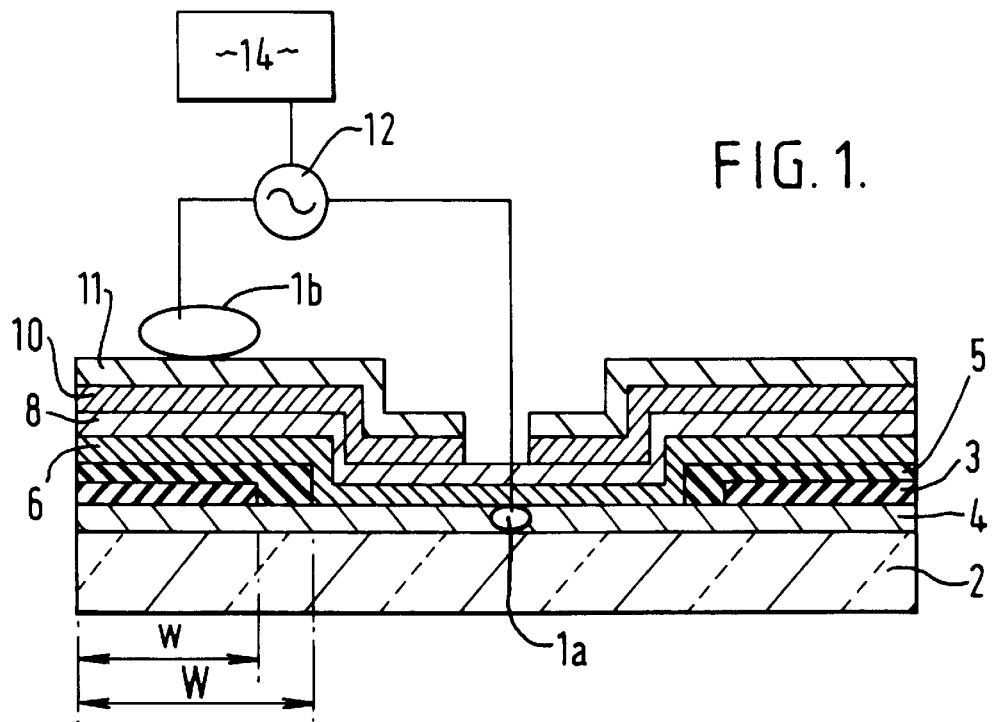
FIG. 1 is a sectional diagram of a device structure.
Figure 2:
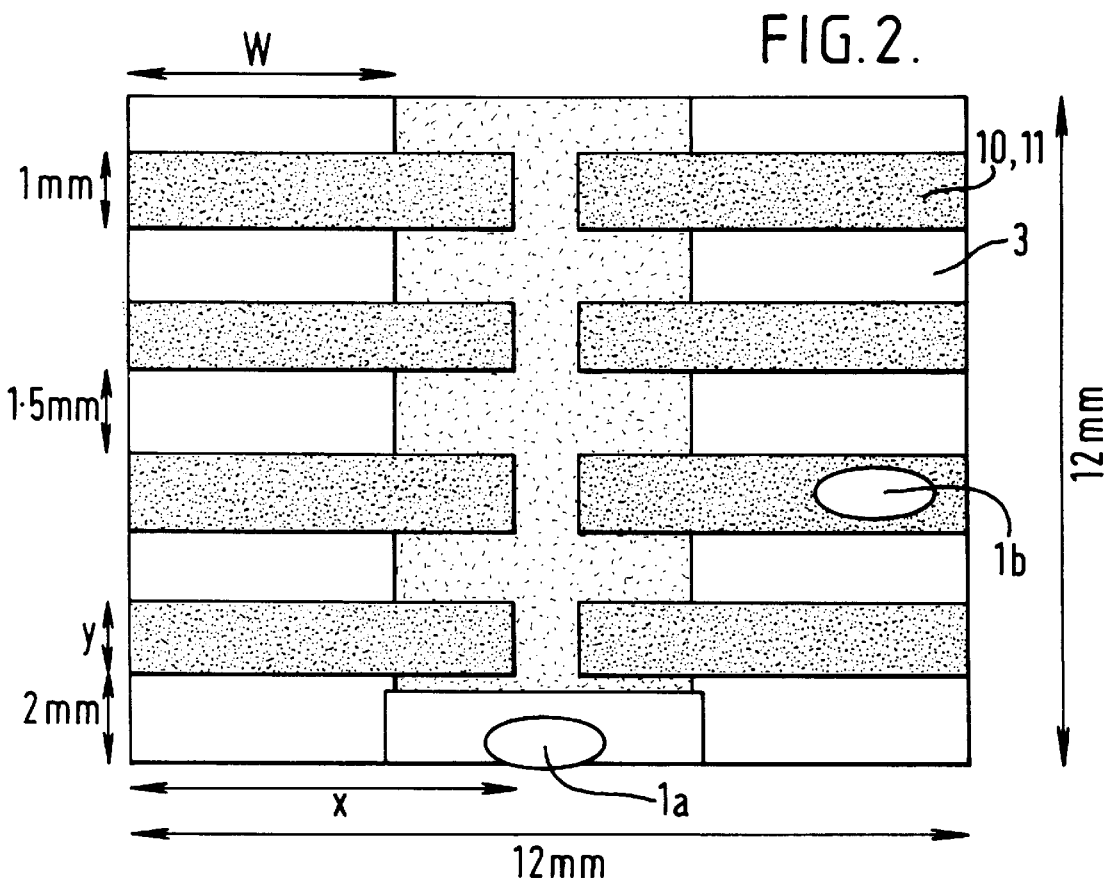
FIG. 2 is a plan view of a device structure of FIG. 1.

A device structure is shown in FIGS. 1 and 2. The light emitting device comprises a glass substrate 2 on which is provided an anode 4 of indium tin oxide. A positive contact 1a is provided in the ITO layer 4. Longitudinally extending metallisation strips 3 of aluminium at a thickness of 100 nm are put down having a width w of ~2.5 mm. These are covered by electrically insulating strips 5 of AlOx at 100 nm having a width W of 3.5 mm. A layer 6 of a conducting polymer, e.g. polystyrene sulphonic acid doped polyethylene dioxythiophene (PEDT/PSS) is deposited over the strips. A light emitting layer 8 is then deposited, for example in the form of a PPV copolymer. Cathode strips 10,11 are then patterned to extend horizontally on top of the light emitting layer. These each have a length x of 5.5 mm and a width y of 1 mm. The cathode strips are formed of 150 nm Ca and 50 nm Al. A negative contact 1b is provided on each of the cathode strips, but only one is illustrated. A voltage supply 12 is connected to supply a voltage between the anode and the cathode under the control of a control unit 14. When manufactured and operated in accordance with the following description, the device can produce a peak brightness output of around 5,000,000 cd/sqm.

In the described embodiment, the device is manufactured as follows.

Indium tin oxide 4 is deposited using either dc or rf sputtering techniques onto the polished glass substrate 2 having an area of 12 mm$^2$. Such substrates are available commercially. Typical products use soda lime glass with a thin silica barrier and an indium tin oxide layer of resistivity of 30 Ohm/square and transparency of about 85%, with a thickness of order 1500 Å. After depositing and patterning the metallisation and electrically insulating strips 3 and 5 (in a manner described below with reference to the second embodiment), the conducting polymer layer 6, a precursor polymer, which is typically a precursor to a copolymer PPV containing tetrahydrathiophene leaving groups and acetate non-leaving groups attached to the vinylene group, is spin-coated on top of the ITO protection layer. The PPV film 8 following conversion is generally in the range of 100–3000 Å and preferably in the range 1000–2000 Å. With this precursor polymer the solubilising group that is removed during conversion is tetrahydrothiophene, and the counter-ion to the thiophenium salt is bromide. After conversion at 150° C. in nitrogen for 4 hours, calcium cathode strips 10 (150 nm thick) are evaporated and capped by aluminium 11 (50 nm). Other thicknesses of both the cathode (10–5000 nm) and aluminium cap layer (10–10,000 nm) are possible. In this structure, each pixel has an area of approximately 2 $mm^2$. This structure is indicated in FIGS. 1 and 2 and is capable of an efficiency of more than 2 lm/W, and a dc peak brightness of more than several thousand cd/sqm.

This device was operated in a pulsed mode using a voltage drive signal indicated in FIG. 3, generated by the control unit 14 and voltage source 12. Pulses of 0.25 microsecond duration (τ) with 90V peak and a peak current density of 600 A/sqcm were used to drive the pixels of the electroluminescent device at a repetition rate of approximately 50 Hz (a cycle time T=20 ms). This represents a duty cycle of 1:80,000. Average brightnesses of ~50 cd/sqm and peak brightnesses of ~5,000,000 cd/sqm were measured as indicated in FIG. 4. As discussed above, a range of frequencies between 10 Hz and 200 Hz is acceptable. For a pulse width of 0.25 μs this gives a range of duty cycles of 1:400,000 to 1:20,000.

SECOND EMBODIMENT

The device structure is shown in FIGS. 5 and 6. In FIGS. 5 and 6 like numerals denote like layers as in FIGS. 1 and 2, although their formation may differ slightly as discussed below. The light emitting device comprises a glass substrate 2 on which is provided an anode of indium tin oxide 4. Metallisation strips 3 and two electrically insulating layers 5 and 16 are patterned on top of the anode 4. The central metallisation strip has a width w of 5.8 mm and the first electrically insulating layer 5 has a width W of 6 mm. The side metallisation strips have a width of 2 mm. The second insulating layer 16 has a width W' of ~4 mm over the central strip. A light emitting layer 8, for example PPV, is then deposited on the patterned substrate. Cathode strips of Ca 10 and Al 11 are then patterned on top of the light emitting layer. The cathode strips 10,11 have the same dimensions as the structure of FIGS. 1 and 2. The device is manufactured as follows. Connections to a voltage supply 12 and control circuit 14 are made as illustrated in FIG. 1.

Indium Tin Oxide 4 is deposited using either dc or rf sputtering techniques onto the polished glass substrate 2 cut to an area of 144 $mm^2$. Typical products use soda lime glass with a thin silica barrier and an ITO layer of resistivity 30 Ohm/square or less and transparency of about 85%, with a thickness of order 150 nm. Such substrates are available commercially. Some of the substrate area was metallised with a layer of about 100 nm of aluminium deposited by dc magnetron sputtering through a shadow mask to form strips 3. These metallised strips were then covered with an insulating layer 5 of aluminium oxide, again sputtered through a shadow mask, and of thickness typically 100 nm and the deposition process was reactive dc magnetron sputtering from an Al target in an argon/oxygen sputter gas mixture. An area of the insulating layer is then painted with precursor pyralin® polyimide resin (commercial product of Du Pont company) which is converted to an insulating polyimide layer 16 of thickness typically 10 μm. Conversion is under dynamic vacuum of around $10^{-5}$ mbar for 6 hours at 200° C. A PPV precursor polymer is then spin-coated onto the device, and converted to the PPV layer 8 by heating to 250° C. in dynamic vacuum of around $10^{-5}$ mbar for 10 hours. The PPV film following conversion is typically around 120 nm thick. With this precursor polymer the solubilising group that is removed during conversion is tetrahydrothiophene, and the counter-ion to the thiophenium salt is chloride. After conversion of the PPV layer the cathode strips 10,11 are thermally evaporated through a shadow mask onto the polymer film. The cathode typically consists of 150 nm of calcium capped with 100 nm of aluminium.

Figure 7:
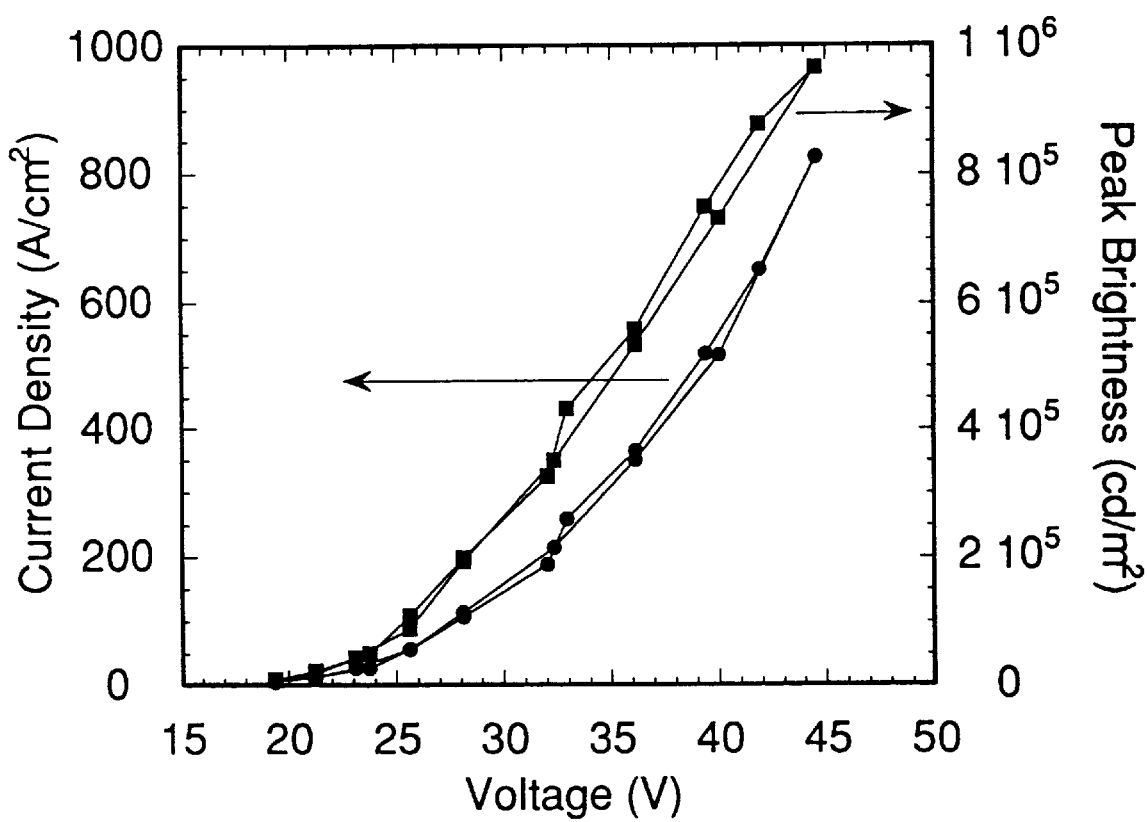
FIG. 7 is a graph of peak current density and peak brightness against applied voltage in the pulse mode for the structure of FIGS. 5 and 6.

The device of FIGS. 5 and 6 was operated in pulsed mode using a voltage drive signal indicated in FIG. 3, generated by the control unit 14 and voltage source 12. A peak brightness of 1M cd/sqcm was measured as indicated in FIG. 7. The average brightness was about 8 cd/sqcm.

Figure 8A:
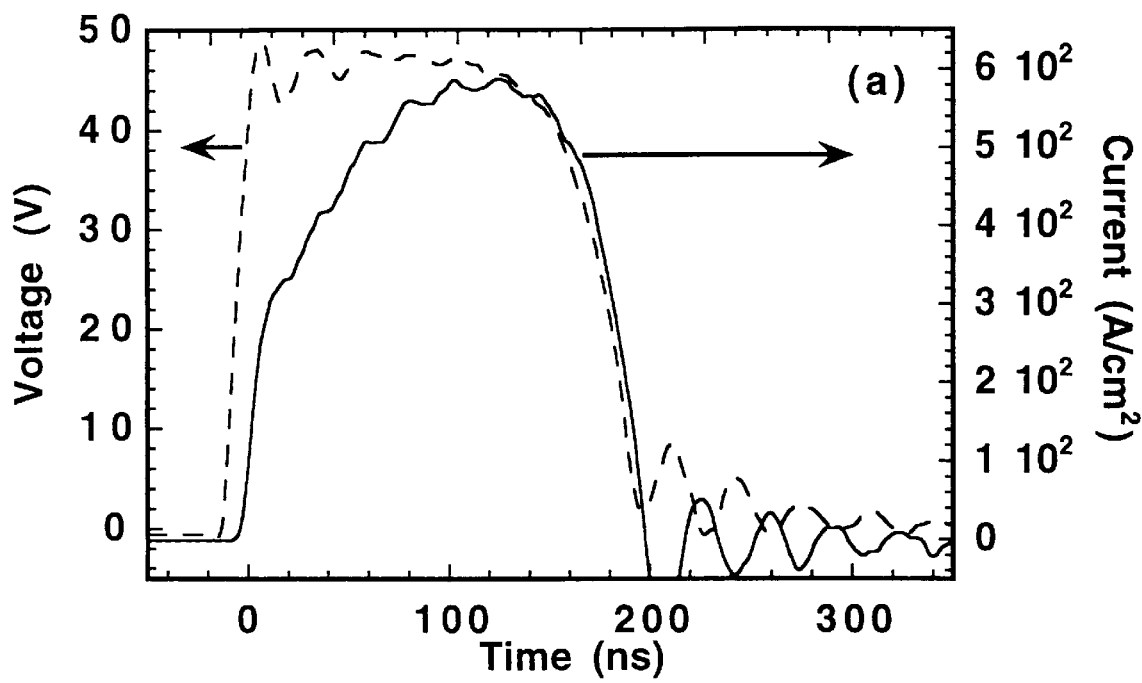
FIG. 8a is a plot of voltage and current against time for the second embodiment.
Figure 8B:
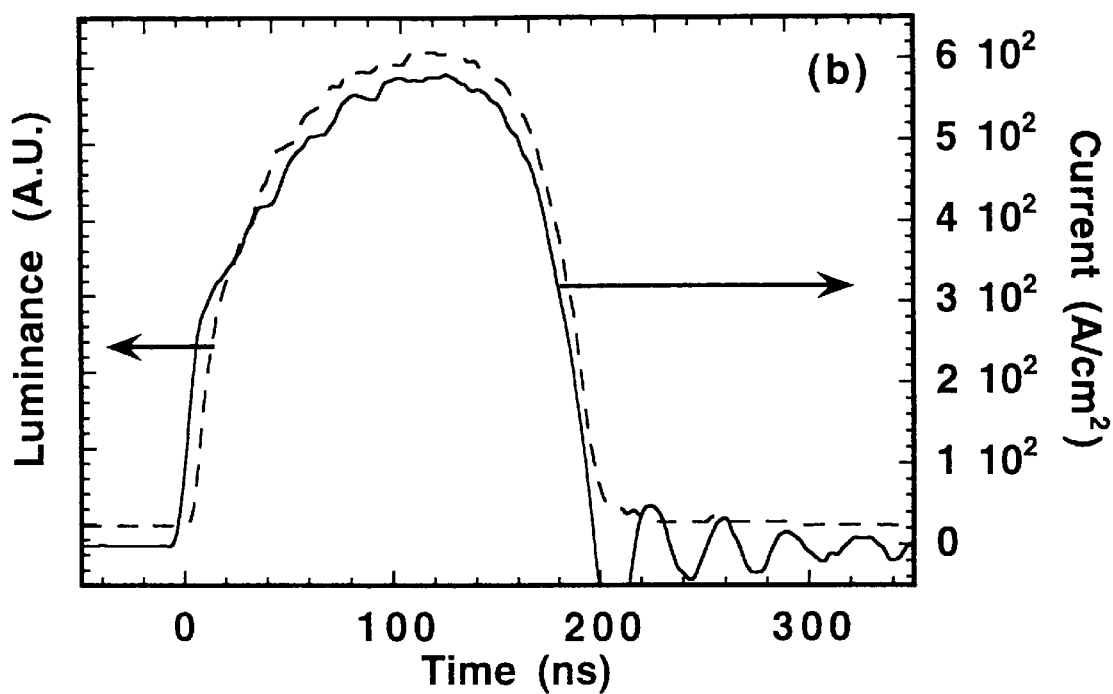
FIG. 8b is a plot of light output and current against time for the second embodiment.

FIG. 8(a) shows that the turn on of the device current to half its maximum value lags the voltage. FIG. 8(b) shows that the device light output and device current have a very similar transient form. The time lag between the current and the voltage is made small because of the reduction in the resistance, capacitance and inductance of the electrical leads and the device electrodes, particularly the anode, and having a small pixel size.

In the above described embodiments, the provision of aluminium metallisation strips over the anode reduces the resistance in the current path so as to allow increased current densities to be injected into the EL layer, without high voltage drops and high power loss and possible damage to the device due to heating.

THIRD EMBODIMENT

A device structure according to a third embodiment of the invention is manufactured as described above with reference to the second embodiment, but with a thicker layer constituting the cathode strips. The thickness of the calcium is around 200 nm and the thickness of the aluminium capping layer is around 320 nm. This allows still higher current densities to be injected (to in excess of 1.4 kA/sqcm).This appears to be due to the fact that increasing the thickness of the Aluminium and Calcium, there is a lower voltage drop and lower resistance and thus less heat dissipation.

The peak brightnesses and peak current densities measured above are significantly higher than achieved to date and are a surprising result of the increased charge mobilities of the devices in the high peak current regime achievable by these duty cycles. It is expected that duty cycles in excess of 1:1000 would provide similar benefits. In particular, these peak current densities are two orders of magnitude greater than has been measured previously and an order of magnitude greater than previous estimates. Also, the peak current densities we have achieved are of the order estimated to be necessary to achieve lasing in an organic light emitting diode. We believe that the increase in mobility within a pulse could be due to the rapid filling of electron and/or hole traps within a short duration due to the high peak currents, allowing the rest of the integrated charge within a particular pulse to be transported with a higher mobility.

What is claimed is:

1. An electroluminescent device comprising:
   a first set of planar electrodes extending in a first orientation;

a layer of an organic light emissive material arranged between the first and second electrodes;

first and second terminals provided respectively on the first and second electrodes; a second set of planar electrodes extending in a second orientation; and circuitry adapted to apply a unipolar voltage pulse directly to the first and second terminals, wherein application of the voltage pulse to the terminals causes the light emissive layer to generate light in an electroluminescent manner, and the resistance of the first set of electrodes is selected such that a peak current density of greater than 50 A/sqcm is manifest in the light emissive material at an applied voltage pulse of less than 90V.

2. An electroluminescent device according to claim 1, wherein the circuitry is configured to apply a sequence of voltage pulses to the first and second terminals with a duty cycle in excess of 1:500.

3. An electroluminescent device according to claim 1, wherein the first planar electrodes comprise anode strips, each comprising a layer of a charge injecting material, a conductive layer and an electrically insulating layer.

4. An electroluminescent device according to claim 3, wherein the charge injecting layer is selected from the group comprising indium tin oxide, fluorine doped tin oxide and aluminium doped zinc oxide.

5. An electroluminescent device according to claim 3, wherein the conductive layer is selected from the group comprising aluminium, copper, copper based alloys and aluminium based alloys.

6. An electroluminescent device according to claim 3, wherein the insulating layer is selected from the group comprising aluminum oxide, silicon oxide, silicon nitride, polyimide and spin-on glass.

7. An electroluminescent device according to claim 1, wherein the voltage pulse has a peak voltage lying in the range of 10–90V and a pulse duration of less than 1 $\mu$s.

8. An electroluminescent device according to claim 7, wherein the voltage pulse has a pulse duration of 0.25 $\mu$s.

9. A method of operating an electroluminescent device comprising first and second electrodes and arranged therebetween a layer of an organic light emissive material, the method including applying a sequence of unipolar voltage pulses with a duty cycle in excess of 1:500 directly across the first and second electrodes to cause the light emissive layer to generate light in an electroluminescent manner.

10. A method according to claim 9, wherein each voltage pulse has a peak voltage lying in the range of 10–90V and a pulse duration of less than 1 $\mu$s.

11. A method according to claim 10, wherein the pulse duration of each voltage pulse is 0.25 $\mu$s.

12. An electroluminescent device comprising:

a first set of planar electrodes extending in a first orientation;

a layer of an organic light emissive material arranged between the first and second electrodes;

first and second terminals provided respectively on the first and second electrodes; a second set of planar electrodes extending in a second orientation; and circuitry arranged to apply a unipolar voltage pulse directly to the first and second terminals, wherein application of the voltage pulse to the terminals causes the light emissive layer to generate light in an electroluminescent manner, and the first electrode comprises a plurality of planar anode strips extending in a first orientation and the second electrode comprises a plurality of planar cathode strips extending in a second orientation, each anode strip comprising a charge injecting layer, a conductive layer and an insulating layer whereby the resistance of the anode strips is selected so that a peak current density of greater than 50 A/sqcm is manifest in the light emissive material at an applied voltage of less than 90V.

13. An electroluminescent device according to claim 12, wherein the charge injected layer is selected from the group comprising indium tin oxide, fluorine doped tin oxide and aluminium doped zinc oxide.

14. An electroluminescent device according to claim 12, wherein the conductive layer is selected from the group comprising aluminium, copper, copper based alloys and aluminium based alloys.

15. An electroluminescent device according to claim 12, wherein the insulating layer is selected from the group comprising aluminium oxide, silicon oxide, silicon nitride, polyimide and spin-on glass.

16. An electroluminescent device according to claim 12, wherein the voltage pulse has a peak voltage lying in the range of 10–90V and a pulse duration of less than 1 $\mu$s.

17. An electroluminescent device according to claim 16, wherein the pulse duration of each voltage pulse is 0.25 $\mu$s.

18. A method of operating an electroluminescent device comprising first and second electrodes and arranged therebetween a layer of an organic light emitting material, the method comprising:

applying a sequence of voltage pulses, each having a pulse duration of less than 1 $\mu$s, with a duty cycle in excess of 1 to 500 directly across the first and second electrodes to cause the light emissive layer to generate light in an electroluminescent manner.

19. An electroluminescent device comprising:

first and second electrodes;

a layer of an organic light emissive material arranged between the first and second electrodes;

first and second terminals connected respectively to the first and second electrodes; and voltage application circuitry connected to the first and second terminals and configured to apply a sequence of unipolar voltage pulses with a duty cycle in excess of 1:500 directly across the first and second electrodes to cause the light emissive layer to generate light in an electroluminescent manner.

20. An electroluminescent device according to claim 19, wherein the voltage application circuitry is configured to apply each voltage pulse with a peak voltage lying in the range of 10 to 90V and a pulse duration of less than 1 $\mu$s.

21. An electroluminescent device according to claim 20, wherein the voltage application circuitry is configured to apply each voltage pulse with a pulse duration of less than 0.25 $\mu$s.

22. A method of operating an electroluminescent device comprising first and second electrodes and arranged therebetween a layer of an organic light emissive material, the method comprising:

applying a unipolar voltage pulse directly across the first and second electrodes to cause the light emissive layer to generate light in an electroluminescent manner, the applied voltage pulse having a voltage of less than 90V, whereby a peak current density of greater than 50 A/sqcm is generated in the light emissive material.

* * * * *

UNITED STATES PATENT AND TRADEMARK OFFICE
CERTIFICATE OF CORRECTION

PATENT NO.   : 6,002,206
DATED        : December 14, 1999
INVENTOR(S)  : Harrison et al.

It is certified that error appears in the above-identified patent and that said Letters Patent is hereby corrected as shown below:

Column 7,
Line 1, claim 1: insert new pargraph --a second set of planar electrodes extending in a second orientation;--
Line 4, claim 1: "first and second electrodes" sholud read --first and second sets of planar electrodes--
Lines 4-5, claim 1: delete "a second set of plantar electrodes extenting in a second orientation;--
Line 11, claim 1: "set of electrodes" should read -- set of plantar electrodes --
Line 56, claim 12: insert new paragraph --a second set of plantar electrodes extending in a second orientation; --
Line 59, claim 12: "first and second electrodes" should read -- first and second sets of planar eletrodes --
Lines 59-60, claim 12: delete " a second set of planar electrodes extending in a second orientation"
Line 65, claim 12: "first electrode" should read --first set of planar electrodes --

UNITED STATES PATENT AND TRADEMARK OFFICE
CERTIFICATE OF CORRECTION

PATENT NO. : 6,002,206
DATED : December 14, 1999
INVENTOR(S) : Harrison et al.

It is certified that error appears in the above-identified patent and that said Letters Patent is hereby corrected as shown below:

Column 8,
Line 1, claim 12: "second electrode" should read -- second set of planar electrodes --
Line 5, claim 12: "the resistance" should read -- a resistance --
Line 30, claim 18: "of voltage" should read -- of unipolar voltage --

Signed and Sealed this

Thirty-first Day of July, 2001

Attest:

NICHOLAS P. GODICI
Attesting Officer
Acting Director of the United States Patent and Trademark Office

UNITED STATES PATENT AND TRADEMARK OFFICE
CERTIFICATE OF CORRECTION

PATENT NO. : 6,002,206
DATED : December 14, 1999
INVENTOR(S) : Harrison et al.

It is certified that error appears in the above-identified patent and that said Letters Patent is hereby corrected as shown below:

Column 7,
Lines 4-5, delete "a second set of planar electrodes extending in a second orientation; --
Line 11, "set of electrodes" should read -- set of planar electrodes --
Line 56, insert new paragraph -- a second set of planar electrodes extending in a second orientation; --

Signed and Sealed this

Eleventh Day of June, 2002

Attest:

JAMES E. ROGAN
Attesting Officer
Director of the United States Patent and Trademark Office